(12) United States Patent
Yang et al.

(10) Patent No.: US 9,117,941 B2
(45) Date of Patent: Aug. 25, 2015

(54) LED PACKAGE AND METHOD OF THE SAME

(71) Applicant: King Dragon International Inc., Tortola (VG)

(72) Inventors: Wen Kun Yang, Hsin-Chu (TW); Yu-Hsiang Yang, Hsin-Chu (TW)

(73) Assignee: King Dragon International Inc., Tortola, Virgin Islands (VG)

( * ) Notice: Subject to any disclaimer, the term of this patent is extended or adjusted under 35 U.S.C. 154(b) by 0 days.

(21) Appl. No.: 14/485,370

(22) Filed: Sep. 12, 2014

(65) Prior Publication Data

US 2015/0004727 A1 Jan. 1, 2015

Related U.S. Application Data

(63) Continuation-in-part of application No. 13/224,748, filed on Sep. 2, 2011, now abandoned.

(51) Int. Cl.

| | |
|---|---|
| *H01L 21/28* | (2006.01) |
| *H01L 33/36* | (2010.01) |
| *H01L 33/44* | (2010.01) |
| *H01L 33/00* | (2010.01) |
| *H01L 21/768* | (2006.01) |
| *H01L 33/60* | (2010.01) |
| *H01L 23/00* | (2006.01) |

(Continued)

(52) U.S. Cl.
CPC ........ *H01L 33/005* (2013.01); *H01L 21/76897* (2013.01); *H01L 24/19* (2013.01); *H01L 33/60* (2013.01); *H01L 33/647* (2013.01); *H01L 24/48* (2013.01); *H01L 33/486* (2013.01); *H01L 33/62* (2013.01); *H01L 33/641* (2013.01); *H01L 2224/48091* (2013.01); *H01L 2224/48247* (2013.01); *H01L 2224/8592* (2013.01); *H01L 2924/00014* (2013.01); *H01L 2924/3011* (2013.01); *H01L 2933/0033* (2013.01); *H01L 2933/0058* (2013.01); *H01L 2933/0066* (2013.01)

(58) Field of Classification Search
CPC .................................................. H01L 33/005
USPC ............................................. 257/99; 438/27
See application file for complete search history.

(56) References Cited

U.S. PATENT DOCUMENTS

| | | | | |
|---|---|---|---|---|
| 5,785,418 | A * | 7/1998 | Hochstein | 362/373 |
| 6,433,429 | B1 * | 8/2002 | Stamper | 257/751 |

(Continued)

*Primary Examiner* — Earl Taylor
(74) *Attorney, Agent, or Firm* — Muncy, Geissler, Olds & Lowe, P.C.

(57) ABSTRACT

A method of LED package includes: forming a P-type through-hole and a N-type through-hole through a substrate; forming a conductive material on the sidewall of said P-type through-hole and N-type through-hole; forming a reflective layer on an upper surface of said substrate; aligning a P-type pad and a N-type pad with said P-type through-hole and said N-type through-hole, respectively, said P-type pad and N-type pad being formed on a first surface of a LED die, wherein said LED die is formed on said upper surface of said substrate; forming electrical connection from said P-type pad and said N-type pad by a copper refilling material within said P-type through-hole and said N-type through-hole; and a P-type terminal pad which positioned under said substrate electrically coupled to said P-type pad via said copper refilling material within said P-type through-hole, and a N-type terminal pad which positioned under said substrate electrically coupled to said N-type pad via said copper refilling material within said N-type through-hole.

9 Claims, 9 Drawing Sheets

(51) Int. Cl.
*H01L 33/48* (2010.01)
*H01L 33/62* (2010.01)
*H01L 33/64* (2010.01)

(56) References Cited

U.S. PATENT DOCUMENTS

| | | | |
|---|---|---|---|
| 6,531,328 B1* | 3/2003 | Chen | 438/26 |
| 6,614,103 B1* | 9/2003 | Durocher et al. | 257/678 |
| 6,874,910 B2* | 4/2005 | Sugimoto et al. | 362/294 |
| 6,964,877 B2* | 11/2005 | Chen et al. | 438/20 |
| 7,183,587 B2* | 2/2007 | Negley et al. | 257/99 |
| 7,256,483 B2* | 8/2007 | Epler et al. | 257/676 |
| 7,259,454 B2* | 8/2007 | Tanida et al. | 257/698 |
| 7,329,614 B2* | 2/2008 | Tanimoto | 438/768 |
| 7,329,942 B2* | 2/2008 | Tsou et al. | 257/594 |
| 7,382,033 B2* | 6/2008 | Roth et al. | 257/432 |
| 7,411,225 B2* | 8/2008 | Kim et al. | 257/100 |
| 7,432,196 B2* | 10/2008 | Tanida et al. | 438/667 |
| 7,470,926 B2* | 12/2008 | Suehiro et al. | 257/10 |
| 7,488,094 B2* | 2/2009 | Murayama et al. | 362/336 |
| 7,521,724 B2* | 4/2009 | Chen et al. | 257/95 |
| 7,547,908 B2* | 6/2009 | Grillot et al. | 257/11 |
| 7,709,952 B2* | 5/2010 | Park et al. | 257/717 |
| 7,750,358 B2* | 7/2010 | Shiraishi et al. | 257/98 |
| 7,786,492 B2* | 8/2010 | Omae et al. | 257/81 |
| 7,824,937 B2* | 11/2010 | Suehiro et al. | 438/26 |
| 7,888,697 B2* | 2/2011 | Kawanobe et al. | 257/98 |
| 7,981,798 B2* | 7/2011 | Taguchi et al. | 438/675 |
| 7,989,237 B2* | 8/2011 | Tseng et al. | 438/27 |
| 7,994,628 B2* | 8/2011 | Tseng et al. | 257/690 |
| 8,101,966 B2* | 1/2012 | Yen | 257/99 |
| 8,154,047 B2* | 4/2012 | Suehiro et al. | 257/100 |
| 8,159,000 B2* | 4/2012 | Lee et al. | 257/99 |
| 8,232,564 B2* | 7/2012 | Chakraborty | 257/88 |
| 8,236,584 B1* | 8/2012 | Chem et al. | 438/26 |
| 8,248,803 B2* | 8/2012 | Lin et al. | 361/709 |
| 8,399,989 B2* | 3/2013 | Lin et al. | 257/758 |
| 8,518,817 B2* | 8/2013 | Anderson et al. | 438/626 |
| 8,569,772 B2* | 10/2013 | Kim | 257/82 |
| 2002/0070449 A1* | 6/2002 | Yagi et al. | 257/734 |
| 2003/0189829 A1* | 10/2003 | Shimizu et al. | 362/240 |
| 2004/0169466 A1* | 9/2004 | Suehiro et al. | 313/512 |
| 2004/0257797 A1* | 12/2004 | Suehiro et al. | 362/34 |
| 2005/0161771 A1* | 7/2005 | Suehiro et al. | 257/612 |
| 2005/0173708 A1* | 8/2005 | Suehiro et al. | 257/79 |
| 2005/0199884 A1* | 9/2005 | Lee et al. | 257/79 |
| 2005/0211997 A1* | 9/2005 | Suehiro et al. | 257/88 |
| 2006/0012299 A1* | 1/2006 | Suehiro et al. | 313/512 |
| 2006/0043402 A1* | 3/2006 | Suehiro et al. | 257/99 |
| 2006/0054913 A1* | 3/2006 | Hadame et al. | 257/99 |
| 2006/0060867 A1* | 3/2006 | Suehiro | 257/81 |
| 2006/0124941 A1* | 6/2006 | Lee et al. | 257/88 |
| 2006/0147746 A1* | 7/2006 | Wakako et al. | 428/627 |
| 2006/0163683 A1* | 7/2006 | Roth et al. | 257/432 |
| 2006/0171152 A1* | 8/2006 | Suehiro et al. | 362/363 |
| 2006/0208271 A1* | 9/2006 | Kim et al. | 257/100 |
| 2006/0261357 A1* | 11/2006 | Tsou et al. | 257/88 |
| 2006/0261364 A1* | 11/2006 | Suehiro et al. | 257/100 |
| 2006/0267206 A1* | 11/2006 | Tanida et al. | 257/773 |
| 2007/0015315 A1* | 1/2007 | Shiraishi et al. | 438/113 |
| 2007/0045782 A1* | 3/2007 | Tanimoto | 257/653 |
| 2007/0108461 A1* | 5/2007 | Shiraishi et al. | 257/98 |
| 2008/0029780 A1* | 2/2008 | Ohtsuka et al. | 257/99 |
| 2008/0203416 A1* | 8/2008 | Konishi et al. | 257/98 |
| 2009/0011592 A1* | 1/2009 | Uno et al. | 438/623 |
| 2009/0039368 A1* | 2/2009 | Omae et al. | 257/98 |
| 2009/0081867 A1* | 3/2009 | Taguchi et al. | 438/675 |
| 2010/0096613 A1* | 4/2010 | Morikawa et al. | 257/4 |
| 2011/0031865 A1* | 2/2011 | Hussell et al. | 313/46 |
| 2011/0175138 A1* | 7/2011 | Bhat et al. | 257/100 |
| 2011/0272716 A1* | 11/2011 | Lee et al. | 257/88 |
| 2012/0037935 A1* | 2/2012 | Yang | 257/98 |
| 2012/0070979 A1* | 3/2012 | Anderson et al. | 438/652 |
| 2012/0153299 A1* | 6/2012 | Yang | 257/77 |
| 2013/0056773 A1* | 3/2013 | Yang | 257/98 |

* cited by examiner

LED PACKAGE AND METHOD OF THE SAME

FIELD OF THE INVENTION

This invention relates to a method of LED package, and more particularly to a method of LED package with through-hole structure and improved thermal dissipation.

DESCRIPTION OF THE PRIOR ART

High performance integrated circuit (IC) packages are well known in the art. Improvements in IC packages are driven by industry demands for increased thermal and electrical performance and decreased size and cost of manufacture. In the field of LED devices, it is required to be package as the IC device. The die density is increased and the device dimension is reduced, continuously. The demand for the packaging techniques in such high density devices is also increased to fit the situation mentioned above. Conventionally, in the flip-chip attachment method, an array of solder bumps is formed on the surface of the die. The formation of the solder bumps may be carried out by using a solder composite material through a solder mask for producing a desired pattern of solder bumps. The function of chip package includes power distribution, signal distribution, heat dissipation, protection and support . . . and so on. As a semiconductor become more complicated, the traditional package technique, for example lead frame package, flex package, rigid package technique, can't meet the demand of producing smaller chip with high density elements on the chip.

The package can have a core made of a common material such as glass epoxy, and can have additional layers laminated onto the core. Patterns may be built in the metal or conductive layer through various etching processes such as wet etching which are known in the art and will not be described further herein. Input/Output functions are typically accomplished using metal traces between the layers. Each trace is generated by its geometry and location on the package. Due to the manufacturing technology and material requirements, packages having built-up layers often include a number of degassing holes in the metal layers. Degassing holes allow gas to be evaporated during the manufacture of the package so that bubbles do not form in the package. Traces may be routed over or under the degassing holes, or around the degassing holes, or a combination thereof. Since the traces are not in the same location on the package, and pass over varying amounts of non-metal areas caused by degassing holes in the metal layers, the traces have an impedance variation, or mismatch. These additional layers are also known as "built-up" layers. The built-up layers are typically formed from alternating layers of dielectric material and conductive material.

FIG. 1 shows a conventional LED package. It includes a substrate 4 with a huge heat sink 2 for thermal dissipation. A heat slug 6 is formed on the substrate 4. A LED die 8 is formed within the heat slug and connected to the wire 16. A phosphor material 10 is coated over the die, and resin molding 12 is coated over the phosphor material 10 for protection. Finally, a lens 14 is arranged over the die. As known in the prior art as FIG. 8, the P-type and N type electrode node of the LED element are formed at the side of light emitting (light come out from the P/N junction) side, the structure will cause light loss due to the emitting electronic maybe blocked by the P-type or N type electrode node of the LED if using the wire bonding method (as FIG. 1) on P & N bonding pads instead of Flip-chip type method. Normally, once the LED element is used for Flip-chip type, the reflection layer must be built inside the LED element. The efficiency of light emitting is influence by the structure. Further, the heat sink of the prior art is too huge to scale down the package.

Therefore, the present invention provides a LED package structure with P, N type through holes to allow the P, N pads surface is different from the surface for emitting light, thereby improving the efficiency and scale down the size of the device and improving the thermal performance.

SUMMARY OF THE INVENTION

An object of the present invention is to provide a LED package with a shorter conductive trace by low cost, high performance and high reliability package.

Another object of the present invention is to provide a convenient, cost-effective method for manufacturing a LED package (chip assembly) by using the bare LED chips as FIG. 8 without bump structure on the P & N electrode pads.

Another object of the present invention is to provide a good thermal management structure to offer the lowest thermal resistance from heat source (inside the chip—P/N junction) to the outside heat sink by using the cooper plug to contact the P/N junction directly without any adhesive materials due to the thermal conductivity of copper around 400 W/mK and using sputtering plus electro-plating method instead of the solder join method (the thermal conductivity of solder (Sn) around 80-20 W/mK).

In one aspect, a LED package includes a substrate with pre-formed and electrically separated P-type through-hole and N-type through-hole through the substrate; wherein a gold or silver or aluminum material formed on the sidewall of said P-type through-hole and N-type through-hole; a reflective layer formed on an upper surface of the substrate; a LED die having P-type pad and N-type pad aligned with the P-type through-hole and the N-type through-hole; wherein the LED die is formed on the upper surface of the substrate and attached by adhesion layer; a Copper refilling material within the P-type through-hole and the N-type through-hole thereby forming electrical connection from the P-type pad and the N-type pad; a phosphor formed along the die surface includes the sidewall of LED die; and a lens formed over the upper surface of the LED die and part of substrate.

The LED package further includes a P-type terminal pad under the substrate and electrical coupled to the P-type pad through the copper material of P-type through hole; a N-type terminal pad under the substrate and electrical coupled to the N-type pad through the copper material of N-type through hole; an active area terminal pad under the substrate and electrical coupled to the active area of the LED element (die).

The transparent adhesive layer is formed on the reflective layer (prefer under the LED die area). The reflective layer is formed by sputtering, or E-plating Ag, Al or etc. LED die (element) includes sapphire substrate with or without reflection layer inside the LED element. The refilling material is formed by Copper.

DESCRIPTION OF THE PREFERRED EMBODIMENT

The invention will now be described in greater detail with preferred embodiments of the invention and illustrations attached. Nevertheless, it should be recognized that the preferred embodiments of the invention is only for illustrating. Besides the preferred embodiment mentioned here, present invention can be practiced in a wide range of other embodiments besides those explicitly described, and the scope of the present invention is expressly not limited expect as specified in the accompanying Claims. The present invention discloses a LED package assembly which includes LED die (element), conductive trace and metal inter-connecting as shown in FIG. 2.

Figure 1:
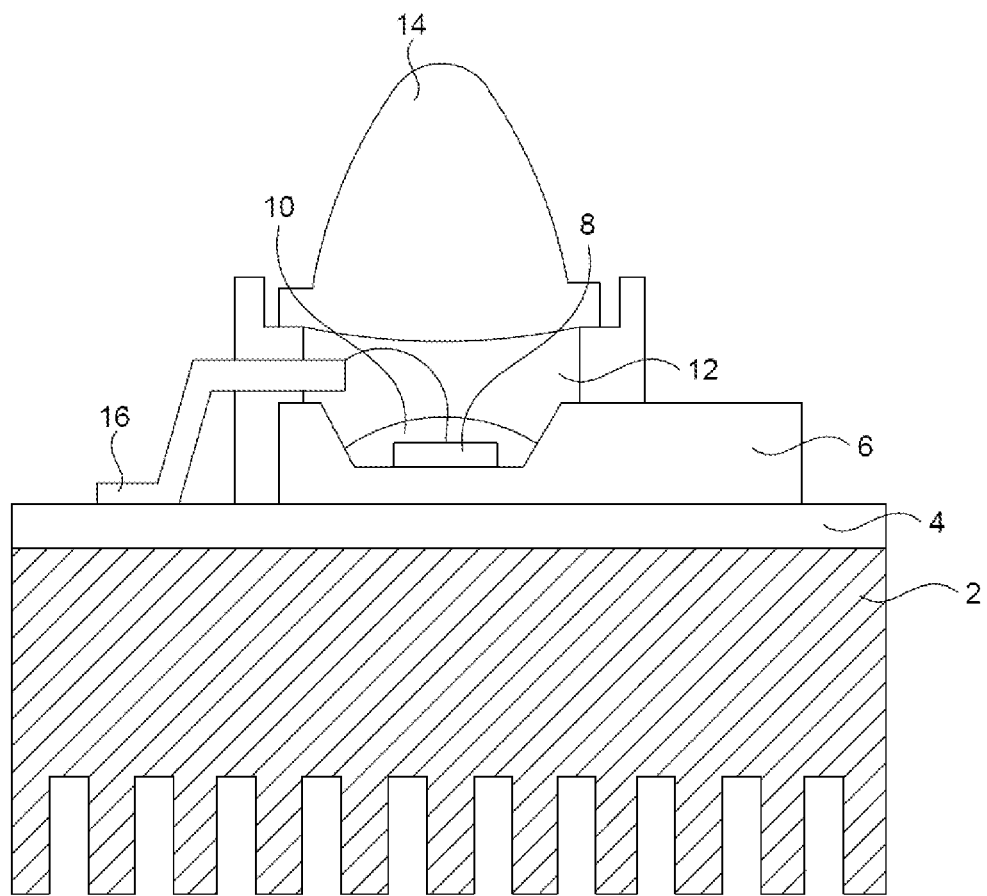
FIG. 1 is cross-sectional views showing a semiconductor chip assembly in accordance with prior art.
Figure 2:
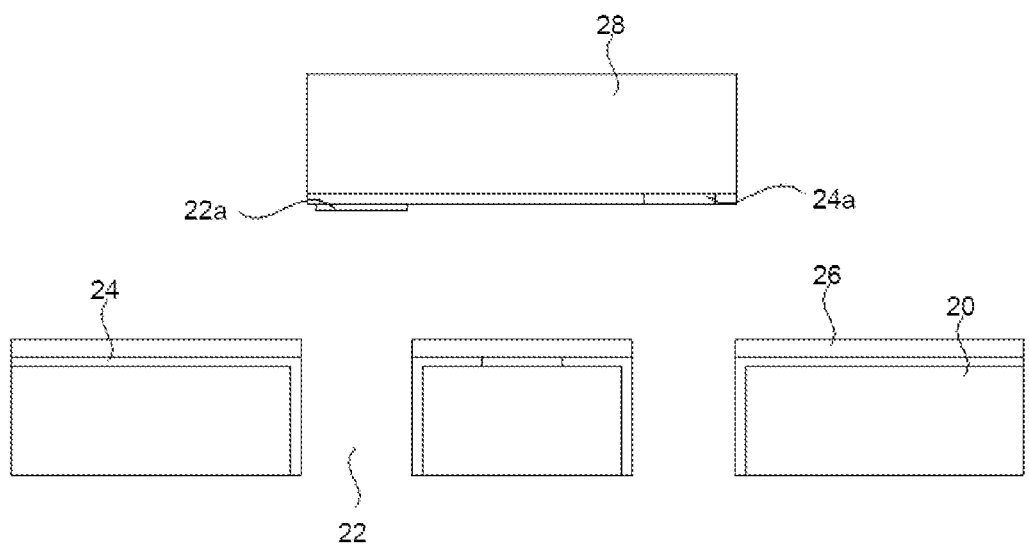
FIG. 2 is cross-sectional views showing a LED chip and substrate in accordance with present invention.

FIG. 2 is cross-sectional view of a substrate 20 with pre-determined through-holes 22 formed therein. The substrate 20 could be a metal, glass, ceramic, silicon, plastic, BT, PCB or PI. The thickness of the substrate 20 is around 40-200 micron-meters. It could be a single or multi-layer (wiring circuit) substrate. A conductive layer 24 is formed along the upper surface of the substrate 20 and is coated on the sidewalls surfaces of the through holes 22. Subsequently, an adhesion layer 26 with high transparent and elastic properties is next formed over the upper surface of the substrate 20 and on the conductive layer 24 (the size of adhesion layer 26 be preferred under the LED die size area (the X/Y size of adhesion layer maybe a little bigger than the LED die size)). The conductive layer 24 can be silver, gold, alumina, thereof to act as the reflection layer. The reflection layer 24 may reflect the light emitting from the die even the adhesive layer 26 is formed on it due to the adhesive layer is formed with high transparent material even under the LED die area. Therefore, the present invention may improve the light emitting efficiency.

Figure 3:
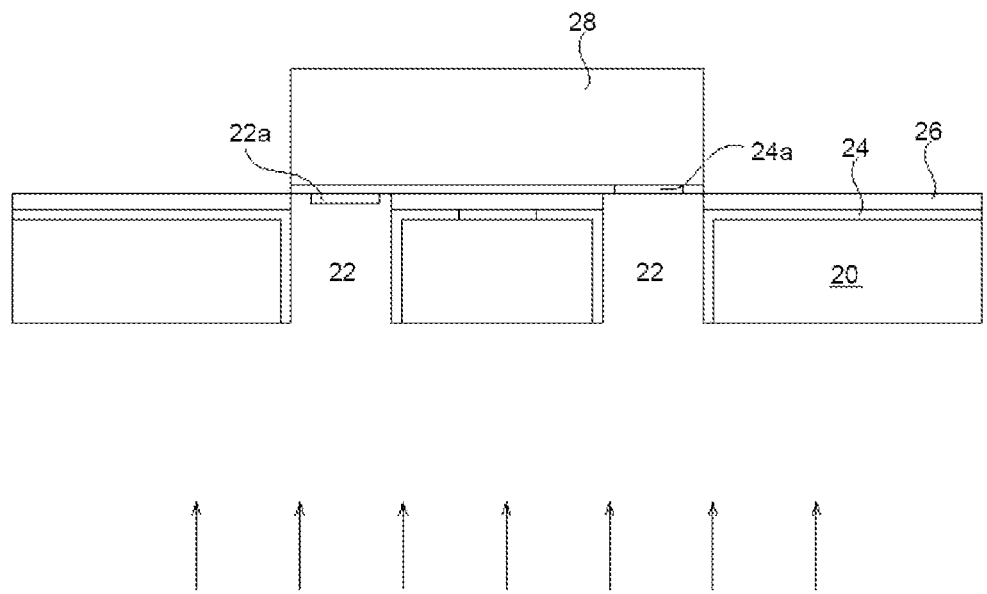
FIG. 3 illustrates a cross section view showing sputtering process in accordance with embodiment of the present invention.
Figure 4:
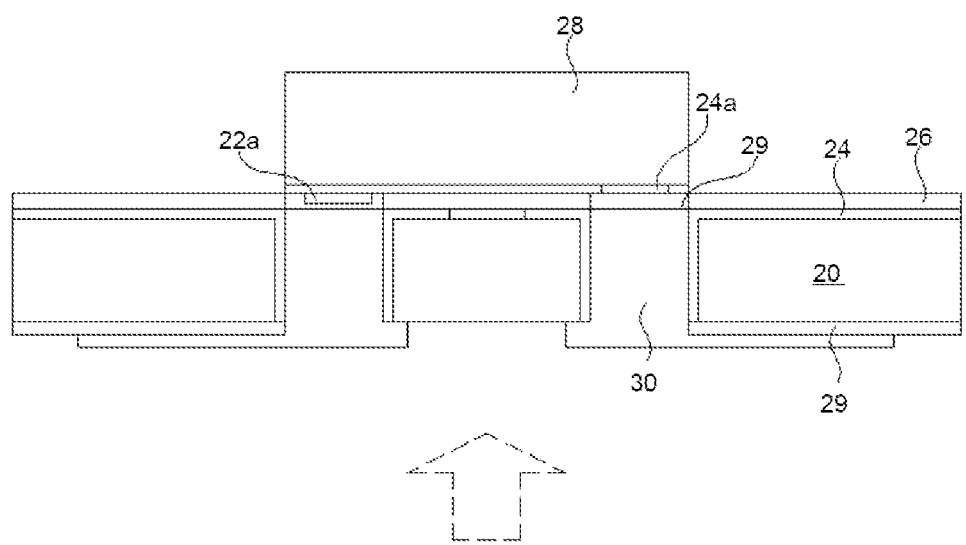
FIG. 4 illustrates a cross section view showing E-plating in accordance with embodiment of the present invention.
Figure 8:
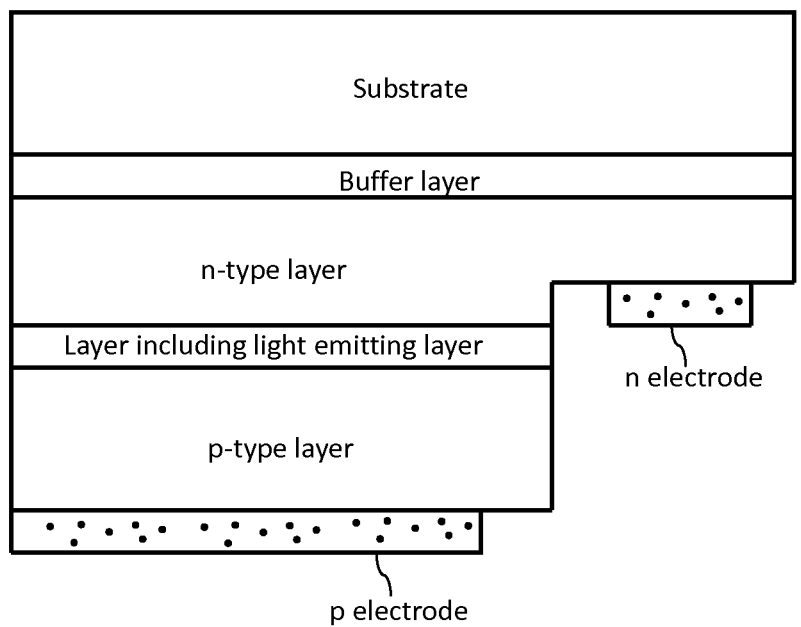
FIG. 8 illustrates the cross section views showing the prior art—LED element.

A LED element 28 as showing in FIG. 8 with sapphire substrate is subsequently adhesion on the upper surface of the substrate 20 by the adhesive layer 26, and the adhesion layer 26 were opened on the P & N-type through-holes area to exposure the P & N-type pads of the LED element. The adhesive layer 26 maybe only cover around the chip size area. The P-type pad 22a and N-type pad 24a are respectively aligned to the through holes 22 which are pre-determined within the substrate 20, as shown in FIG. 3. The P-type pad 22a refers to the pad for the P-type conductive material of the LED, and the N-type pad 24a refers to the pad for the N-type conductive material of the LED (refer to FIG. 8, the N-type pads may lower than P-type pads a few micron-meter (um), it can be overcame by adhesion layer after mounting on the substrate, due to the adhesion layer is elastic properties). As shown in FIG. 3, the LED element 28 faces down to the substrate and allow the P-type pad 22a and N-type pad 24a both are exposed by the through holes 22, downwardly. Then, a sputtering process is performed from the backside of the substrate to deposit a conductive layer on the lower surface of the substrate 20 and into the through holes, thereby forming the conductive layer on the N-type pad and the P-type pad as well to act as seed/reflective layer 29 for the LED 28 if the bare LED element does not have the built-in reflective layer inside the LED element (chips). The seed/reflective conductive layer can be silver, copper, alumina, titanium and the any combination thereof.

Figure 7:
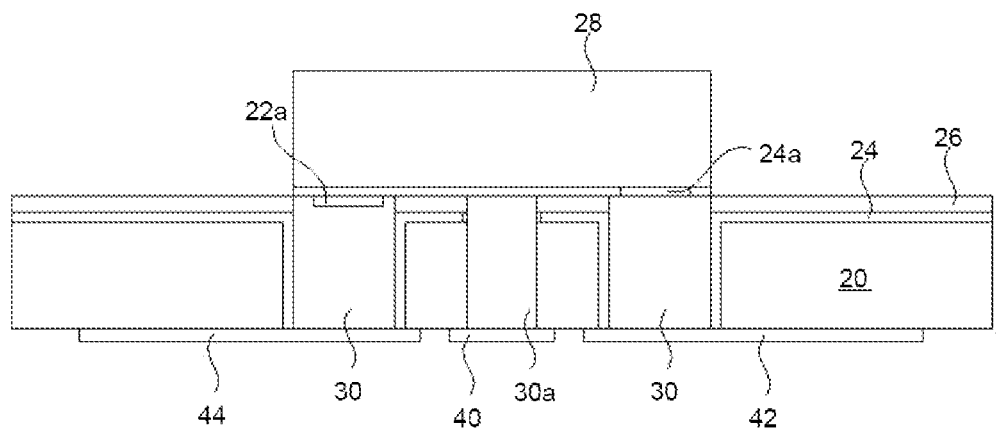
FIG. 7 illustrates cross section views showing the terminal pads in accordance with embodiment of the present invention.
Figure 9:
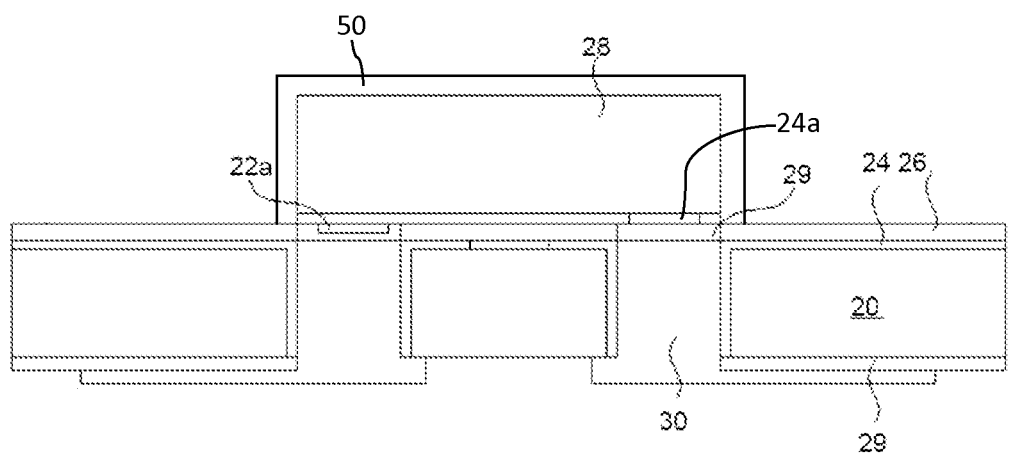
FIG. 9 illustrates the cross section views showing the phosphor along the surface of LED element in accordance with further embodiment of the present invention.

Next, a photo-resist layer (not shown) is patterned by lithography process to form a desired circuit pattern on the backside surface of the substrate 20 and the through-holes are exposed by the photo-resist layer. A copper refilling material 30 is subsequently formed within the through-holes and it is refilled the holes, it can be achieved by well-known electro-plating method. Terminal pads refilling material 30a are also defined on the backside surface of the substrate and some of them may be connected to the refilling material 30 as shown in FIG. 7. After the traces are defined, the photo-resist layer is stripped away by solution. The deposition of the refilling material 30, 30a is preferably formed by the Electro-plating process as known in the art. Then, maybe a phosphor material 50 as shown in FIG. 9 is formed along the surface of LED element to achieve the different lighting color, maybe a lens for the LED element 28 is attached on the upper surface of the substrate 20 to cover the entire LED element 28, please refer to FIG. 5.

The through holes can be formed within the substrate 20 by laser, mechanical drill, or etching. The P-type and the N-type pads 22a, 24a may be coupled to the terminal pads 44, 42 via the copper refilling material 30. As shown in the illustrations, the refilling material (also refer to interconnecting structures) 30 are coupled to the N, P-type pads and the terminal pads 30a. Traces (not shown) may be configured on the lower or upper surface of the substrate 20. The prior art huge heat sink is not present in the present invention to squeeze the size of the package. In one example, phosphor material 50 is formed on a second surface of the LED die (including the sidewall surface); the P, N type pads are formed on LED's first surface which is different from the second surface. Thus, the emitting light will not be blocked by the P, N type pads 22a, 24a compared with the wire bonding and non-flip-chip type package.

Figure 5:
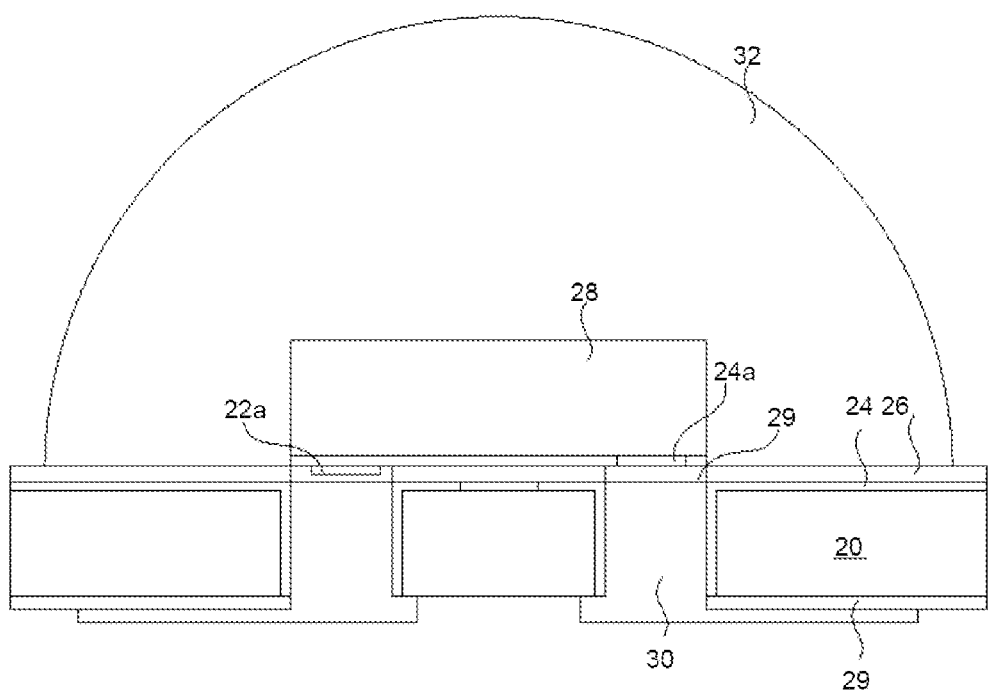
FIG. 5 illustrates a cross section view showing LED lens in accordance with further embodiment of the present invention.
Figure 6:
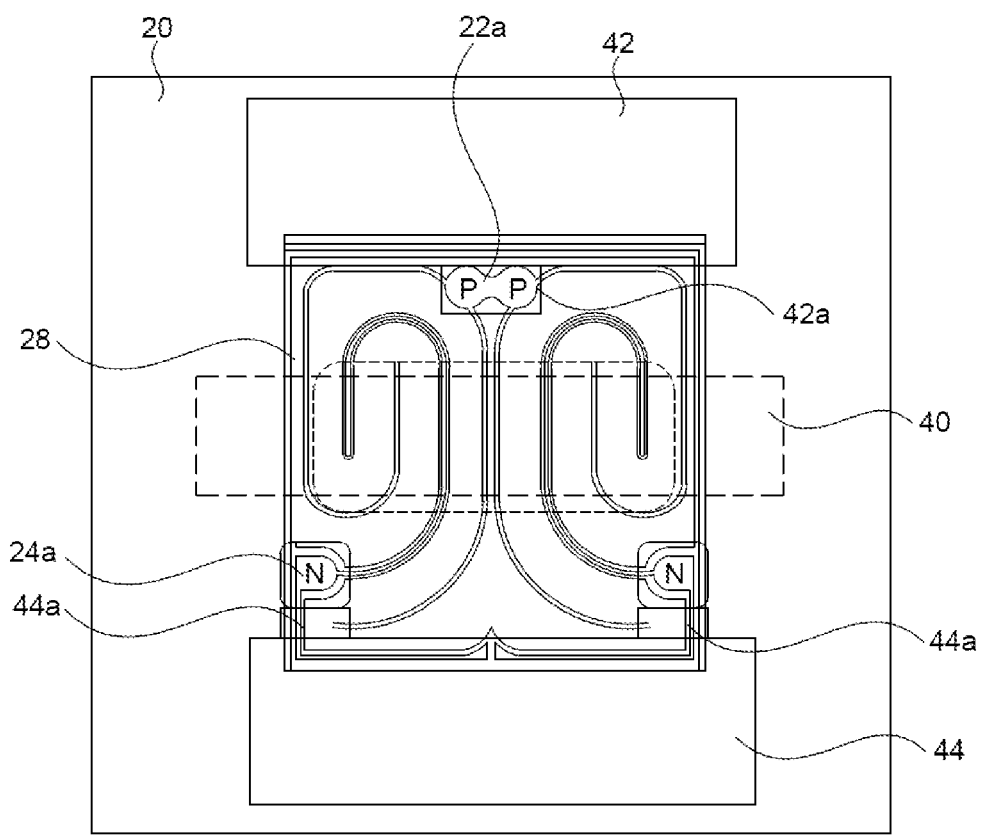
FIG. 6 illustrates a bottom view in accordance with embodiment of the present invention.

FIG. 6 illustrates the diagram viewing from bottom of FIG. 5, the lower surface of the LED 28 includes active region having P-type pads which are exposed by a P type through hole 22a, and N-type pads which are exposed by the N type through holes 24a. The active area refers to the region with P-N layers of the LED. The LED element 28 is receiving within the shadow of the substrate 20. A P-type terminal pad 42 is formed under the substrate 20 and connected to the P-type pad via the refilling plug (through hole) and a connection structure 42a of the P-type terminal pad 42; The N-type terminal pad 44 is formed under the substrate 20 as well and are connected to the N-type pads respectively by the refilling through hole and the connection structure 44a of the N-type terminal pad 44. Another active terminal pad 40 is provided within the substrate 20 under the area of the active area of the LED device. The arrangement and configuration may offer short signal traces for the LED and it may effectively drain the thermal generated by the LED out of the device through the terminal pads 42, 44 and 40, thereby improving the performance of the thermal dissipation, the terminal pads 42, 44 and 40 maybe acted as heat sink in present invention.

The present invention may employ the conventional LED with sapphire substrate without the reflection layer inside the LED element as shown in FIG. 5. No need to develop new type of LED element. The reflection layer 24 will be formed on the upper surface of the substrate 20 and may be exposed by the high transparent adhesive layer 26 by sputtering processes, simple material, low cost for the LED package and also using the lowest cost of LED element. The refilling material in the through holes and terminal pads offer shorter distance for signal transmission, and better thermal conductivity. The emitting light may fully radiate out of the LED element and less reflection loss is achieved. The thermal metal pads are easy to be formed; the thermal metal pad is on the passivation layer (SiO2) of LED die near the P/N junction of LED element, it offers lowest thermal resistance. Alternative, the refilling material by plating is formed by sputtering, Electro-plating the Cu or Cu/Ni/Au which means the plating copper is major metal, then plating Ni/Au are the finish metal on the surface of the terminal pads during the electro-plating process.

Although preferred embodiments of the present invention have been described, it will be understood by those skilled in the art that the present invention should not be limited to the described preferred embodiment. Rather, various changes and modifications can be made within the spirit and scope of the present invention, as defined by the following Claims.

What is claimed is:

1. A method of LED package comprising:
   forming a P-type through-hole and a N-type through-hole through a substrate;
   forming a conductive material on the sidewall of said P-type through-hole and N-type through-hole;
   forming a reflective layer on an upper surface of said substrate;
   aligning a P-type pad and a N-type pad with said P-type through-hole and said N-type through-hole, respectively, said P-type pad and N-type pad being formed on a first surface of a LED die with respectively different pre-determined heights, wherein said LED die is formed on said upper surface of said substrate;
   forming electrical connections from said P-type pad and said N-type pad by a copper refilling material within said P-type through-hole and said N-type through-hole; and
   a P-type terminal pad which is positioned under said substrate electrically coupled to said P-type pad via said copper refilling material within said P-type through-hole, and a N-type terminal pad which is positioned under said substrate electrically coupled to said N-type pad via said copper refilling material within said N-type through-hole.

2. The method of LED package of claim 1, further comprising a lens formed over said upper surface of said substrate.

3. The method of LED package of claim 1, said conductive material comprises silver, gold or aluminum.

4. The method of LED package of claim 1, further comprising an active area terminal pad under said substrate and coupled to an active area of said LED device.

5. The method of LED structure of claim 1, further comprising a transparent adhesive layer formed on said reflective layer.

6. The method of LED package of claim 5, wherein said reflective layer is formed by sputtering, or Electro-plating Ag, Al or Au.

7. The method of LED package of claim 1, wherein said LED die includes sapphire substrate without reflection layer inside said LED die.

8. The method of LED package of claim 7, wherein a phosphor material is formed on a second surface of said LED die including the sidewall of said LED die, wherein said first surface is different from said second surface.

9. The method of LED package of claim 1, wherein a finish material on said surface of said terminal pad is formed by Ni/Au.

\* \* \* \* \*